(12) United States Patent
Hendrix et al.

(10) Patent No.: US 6,514,835 B1
(45) Date of Patent: Feb. 4, 2003

(54) STRESS CONTROL OF THIN FILMS BY MECHANICAL DEFORMATION OF WAFER SUBSTRATE

(75) Inventors: Bryan C. Hendrix, Danbury, CT (US); Jeffrey F. Roeder, Brookfield, CT (US); Steven M. Bilodeau, Oxford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/676,283

(22) Filed: Sep. 28, 2000

Related U.S. Application Data

(63) Continuation of application No. 09/033,631, filed on Mar. 3, 1998, now Pat. No. 6,156,623.

(51) Int. Cl.$^7$ .......................... H01L 21/20; H01L 21/36
(52) U.S. Cl. ...................... 438/457; 438/492; 438/503
(58) Field of Search ................ 438/457, 492, 438/493, 507, 509, 3, 503, 504; 117/94

(56) References Cited

U.S. PATENT DOCUMENTS

| | | | | |
|---|---|---|---|---|
| 3,458,369 A | * | 7/1969 | Marinace ..................... | 438/33 |
| 3,808,674 A | * | 5/1974 | Francombe et al. .......... | 117/94 |
| 3,821,033 A | * | 6/1974 | Hu .............................. | 117/56 |
| 3,856,647 A | | 12/1974 | Blachman ................... | 204/192 |
| 4,144,057 A | * | 3/1979 | Melton et al. .............. | 420/457 |
| 4,159,214 A | * | 6/1979 | Mason ....................... | 117/97 |
| 4,304,613 A | * | 12/1981 | Wang et al. ................ | 148/563 |
| 4,548,658 A | * | 10/1985 | Cook ......................... | 117/90 |
| 4,830,984 A | * | 5/1989 | Purdes ....................... | 438/492 |
| 4,874,438 A | | 10/1989 | Oshita et al. ............... | 148/400 |
| 5,012,304 A | | 4/1991 | Kash et al. .................. | 357/7 |
| 5,154,810 A | | 10/1992 | Kamerling et al. ......... | 201/192.13 |
| 5,471,721 A | * | 12/1995 | Haertling .................... | 29/25.35 |
| 5,750,272 A | * | 5/1998 | Jardine ....................... | 428/686 |
| 5,787,104 A | * | 7/1998 | Kamiyama et al. .......... | 372/43 |
| 5,849,125 A | * | 12/1998 | Clark ......................... | 156/222 |
| 5,874,351 A | | 2/1999 | Hu et al. .................... | 438/257 |
| 5,893,760 A | | 4/1999 | Mikata et al. .............. | 438/795 |
| 5,907,770 A | | 5/1999 | Yamazaki et al. .......... | 438/149 |
| 6,020,216 A | | 2/2000 | Beratan et al. .............. | 438/54 |

OTHER PUBLICATIONS

Hodge et al., "Stresses in Thin Film Metallization", IEEE Trans. On Components, Packaging, and Manufacturing Tech.—Part A, vol. 20, No. 2, Jun. 1997, pp. 241–250.

(List continued on next page.)

Primary Examiner—Matthew Smith
Assistant Examiner—Lex H. Malsawma
(74) Attorney, Agent, or Firm—Margaret Chappuis; Steven J. Hultquist

(57) ABSTRACT

A method of improving the physical and/or electrical and/or magnetic properties of a thin film material formed on a substrate, wherein the properties of the thin film material are stress-dependent, by selectively applying force to the substrate during the film formation and/or thereafter during the cooling of the film in the case of a film formed at elevated temperature, to impose through the substrate an applied force condition opposing or enhancing the retention of stress in the product film. The method of the invention has particular utility in the formation of ferroelectric thin films which are grown at temperature above the Curie temperature, and which may be placed in tension during the cooling of the film to provide ferroelectric domains with polarization in the plane of the film.

20 Claims, 4 Drawing Sheets

OTHER PUBLICATIONS

Haertling, G.H., "PLZT Electrooptic Materials and Applications–A Review", Ferroelectrics, vol. 75, 1987, pp. 25–55.

Maldonado, J., et al., "Strain–Biased Ferroelectric–Photoconductor Image Storage and Display Devices", Proc. IEEE, vol. 59, No. 3, 1971, pp. 368–382.

Tuttle, B.A., "Relationships Between Ferroelectric 90° Domain Formation and Electrical Properties of Chemically Prepared Pb(Zr, Ti)$O_3$ Thin Films", Science and Technology of Electroceramic Thin Films–NATO ASI Series–Series E: Applied Sciences, O. Auciello and R. waser, Eds, vol. 284, 1985, pp. 117–132.

Tominaga, K., et al., "Preparation of C–Axis–Oriented PLT Thin Films by the Metalorganic Chemical Vapor Deposition Method", Jap. J. of Appl. Phys., vol. 29, No. 10, 1990, pp. L1874–6.

Iijima, K., et al., "Preparation and Properties of Lanthanum Modified PbTi$O_3$ Thin Films by rf–Magnetron Sputtering", Proc IEEE, International Symposium on Applications of Ferroelectrics, R.K. Pandey, M. Lieu and A Safari, Eds., 1994, p. 53.

Haertling, G.H., "Electronic Ceramics; Properties, Devices, and Applications", L. Levinson, Ed., 1988, pp. 428–492.

Haertling, "Stress–Induced Effects in PLZT Ceramics", Proceedings of the IEEE International Symposium on Applications of Ferroelectrics, Aug. 18–21, 1996, pp. 65–68 vol. 1.*

* cited by examiner

STRESS CONTROL OF THIN FILMS BY MECHANICAL DEFORMATION OF WAFER SUBSTRATE

This is a continuation division of U.S. application Ser. No. 09/033,631 now U.S. Pat. No. 6,156,623 filed Mar. 3, 1998.

BACKGROUND OF THE INVENTION

1. Field of the Invention

The present invention relates to methodology for controlling the residual stresses in thin film materials formed by deposition on a substrate, and also relates to thin film structures which are characterized by reduced stress therein relative to thin films of corresponding materials produced by the prior art.

2. Description of the Related Art

In the prior art fabrication of thin film materials such as metal-containing films formed by vapor phase deposition processes, including metal oxides having use in semiconductor device applications, residual stresses in the deposited thin film material can render the film deficient or even useless for its intended function. In other cases, certain amounts of a tensile or compressive stress are beneficial.

Such residual stresses may for example interfere with desired properties of the product film, such as piezoelectric, paraelectric, superconducting, ferroelectric, and memory (in the case of memory alloy thin films) properties, and the residual stresses may compromise the structural integrity of the material, particularly in applications where the thin film is subjected to differential thermal effects or mechanical impact, vibration, etc.

For these reasons, it is desirable to form thin film materials in such manner as to minimize and/or otherwise control the residual stress in the product material.

The prior art has attempted to minimize the residual stresses in thin film materials by focusing largely on the selection and manipulation of the process conditions, using film-forming methods such as chemical vapor deposition (CVD), physical vapor deposition (PVD), spin-on formation, etc.

In addition to such process conditions approach, there has been recognition that the mechanical fixturing and physical set-up of the substrate element on which the thin film is formed may have significant impact on the stress state of the final product film.

For example, in discussing the highly compliant nature of PLZT (Pb—La—Zr—Ti—O), Haertling (G.H. Haertling, *Ferroelectrics*, 1987, Vol. 75, pp. 25–55, III. Properties, 2. Mechanical Properties, $2^{nd}$ paragraph) has mentioned a device reported in J. Maldonado and A. Meitzler, *Proc. IEEE*, 1971, Vol. 59, p. 368, in which "domain orientation was accomplished by mechanically flexing a PLZT plate bonded to a plexiglas substrate". This work evidences the fact that stress can be used to control domain orientation.

The present invention is therefore directed to an improved methodology to control the stress in thin film materials formed on a substrate, and to correspondingly improved thin film materials having enhanced stress characteristics relative to the films produced by the prior art.

SUMMARY OF THE INVENTION

In accordance with the present invention, there is provided an improved methodology for forming a thin film material on a substrate by deposition on a substrate of film-forming material therefor, in which the substrate is subjected to deformation or force to produce films of significantly improved character, relative to corresponding films produced by deposition on a substrate not subjected to such deformation or force.

In one aspect of the invention, the polarization direction of a ferroelectric film grown above the Curie temperature (in the paraelectric state), which can be significantly influenced by the state and magnitude of stress as the film becomes ferroelectric upon cooling below the Curie temperature, is formed on a substrate while the substrate is subjected to the application of force in a manner which opposes the stress evolution otherwise experienced in the cool-down from the film-forming temperature.

The method of the invention is advantageous in application to formation of films that undergo diffusionless phase transformations typically involving the displacement of atoms and a change in crystal symmetry. Examples of technologically important materials of such type include steel, memory alloys (NiTi and Cu-based alloys), dielectric materials such as $BaSrTiO_3$, polymeric materials, and piezoelectric materials. For example, the method of the invention may be employed for oriented polymeric materials, e.g., piezoelectrics such as polyvinylidene difluoride (PVDF), useful as a piezoelectric and pyroelectric material, and potentially for other dielectric applications, such as low k value dielectrics.

The method of the invention is also applicable to the formation of films that undergo phase changes during processing where stress is usefully employed to control the crystallographic texture of the material. Nuclei will form in the parent phase in an orientation that minimizes the free energy of the system, and if the parent phase film is stressed, then the nuclei will tend to form with a soft direction in the plane of the film to minimize its strain energy. The soft direction of a crystalline film material is the crystallographic direction that is elastically more compliant than the other crystallographic directions of such material. For example, in a copper crystal, the <100> family of directions is typically more compliant than are the <111> directions.

The method of stress engineering in accordance with the invention is also usefully employed in a wide variety of materials fabrication applications, such as for example the formation on a silicon substrate of a sputtered metal film whose growth stress is large and compressive. Since the coefficient of thermal expansion (CTE) of the metal film is greater than the CTE of the Si substrate material, the stress in the film at room temperature can be reduced by sputtering at an elevated temperature. At the elevated deposition temperature, the film is still in compression, but as it cools on the substrate, it approaches a stress-free state. However, such elevated temperature film-formation conditions may be detrimental to other layers of an integrated circuit (IC) device. The same near-stress-free state can be obtained in accordance with the present invention by constraining the substrate during the sputter deposition and then releasing the constraint after deposition, so that the top surface of the substrate is given the amount of compressive strain as is needed to be released from the sputtered metal layer.

The methodology of the invention is also applicable in the converse to films that have little growth stress, but must be deposited at a high temperature because of the constraints of a CVD or other elevated temperature process. In such case, the thermal expansion mismatch strain can be compensated in the practice of the invention by constraining the substrate at the deposition temperature. In this way, there is little or no stress during deposition, and a stress is created during cooling, but the stress is then relieved by removing the wafer constraint.

The stress of a film at or away from the processing temperature often controls the desired properties of the film, which may include tribological, optical, thermal, magnetic, electrical, etc., properties. An important application of this problem is control of the crystalline orientation of perovskite thin films such as $Pb(Zr,Ti)O_3$ (PZT), which are currently being developed for non-volatile memories, pyroelectric IR imaging arrays, high permittivity capacitor dielectrics and electro-optic spatial light modulators. For ferroelectric PZT, the important electrical and electro-mechanical properties are anisotropic, and for most applications there is an optimum crystalline orientation. The role of stress in PZT thin films, particularly as in determining the crystalline orientation of the perovskite film during cooling of a film through the Curie transition, is described in "Relationships Between Ferroelectric 90° Domain Formation and Electrical Properties of Chemically Prepared $Pb(Zr,Ti)O_3$ (PZT) Thin Films", by Tuttle et al., Science and Technology of Electronic Materials—NATO ASI Series—Series E: Applied Sciences, O. Auciello and R. Waser, Eds. vol. 284, p. 117, (1995).

The methodology of the invention is useful in a broad class of situations where there is some reason to control the stress in the film independent of other process conditions.

In many instances, it may be preferred to deposit the film without constraining the substrate, and then in accordance with the methodology of the invention, to constrain the substrate for some post-processing period in order to alter the properties of the film or to alter the way that the film develops under post-processing conditions.

In a specific aspect, the invention may be carried out with a wafer to the backside of which (opposite the side of the wafer on which the product film is being formed) is secured a film, plate, or other material element formed of a material of construction having a different CTE in relation to the wafer, so that the wafer is bent or deformed in a selective manner.

Other aspects, features and advantages of the present invention will be more fully apparent from the ensuing disclosure and appended claims.

DETAILED DESCRIPTION OF THE INVENTION, AND PREFERRED EMBODIMENTS THEREOF

Figure 1A:
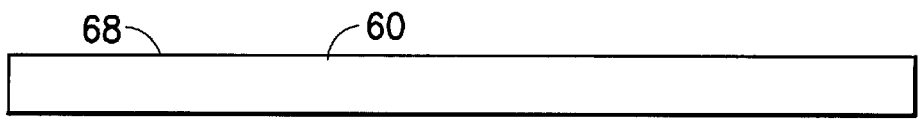
FIG. 1a is a schematic representation of an uncoated substrate.

The present invention is based on the discovery that the physical, electrical, and/or magnetic properties of a thin film material, wherein such properties are stress-dependent, may be significantly improved by selectively applying force to the substrate during the film formation and/or thereafter during the cooling of the film in the case of elevated temperature film formation, for the purpose of imposing, through the substrate, an applied force condition opposing the retention or generation of stress in the product film.

In general, the stress of a thin film material (wherein "thin film" refers to films having a thickness of less than about 2000 $\mu$m) may be determined quantitatively by procedures comparing films prepared with and without the use of substrate curvature, or X-ray diffraction determination of the lattice parameter at different angles with respect to the film normal. Such analyses can provide a means for comparing each resulting film stress profile against the stress present in a corresponding film formed without any application of force on the substrate. Once the character of the applied force (tension or compression) is determined, the quantification of the applied force desirably employed can be similarly carried out, to determine the magnitude of the applied force best suited for the given end use application in which the thin film material is to be employed.

When a conventional wafer substrate is employed as a base structure for the formation of the thin film of material thereon, a wafer chuck, curved mandrel with clamps or other retention structure may be modified to exert the proper force on the substrate during the deposition of the film-forming material thereon. For example, a ring-type holder could be employed for a circular wafer which circumferentially compressively holds the wafer during the film formation process, to exert the compression which serves to reduce the stress in the product film. Alternatively, for films whose stress are beneficially reduced by being in tension during the film formation, a similar fixture may be employed to clamp the wafer at circumferentially spaced-apart intervals of the wafer's periphery, and exert a radially outwardly directed force on the substrate.

A curved mandrel may also be used to hold the substrate in a curved position during the deposition of the film forming material onto the concave side of the substrate. Sometime after the completion of the film forming process, the substrate may be released from the curved mandrel causing the film material to experience tensile stress.

If it is desired to exert compressive force on the main surfaces of a wafer or other substrate element, a non-brittle substrate could be used with an array of laterally spaced-apart projection "pins" on a base support member that can be brought into facial registration with the top and bottom surfaces of the wafer, so that the ends of the pins exert localized force on the faces of the substrate. Conversely, if tension is desired to be exerted on each of such surfaces of a wafer or similar substrate element, an array of laterally spaced-apart suction tubes could be brought into contact with the face of the substrate and vacuum applied to the tube interior spaces, to exert tensional force on the faces of the substrate.

Another approach is to employ a backside metal or other material film on the back side of the wafer (in relation to the front side of the wafer) presenting the surface on which the product material film is being formed. The backside film will be selected to have a different CTE in relation to the wafer, so that during temperature differentials it effects bending of the wafer in a desired direction (e.g., concavely or convexly) on the surface on which the product film is being formed.

It will be appreciated that there are a very wide variety of means that may be readily utilized to exert force of a proper magnitude and directional character on a substrate, as will readily suggest themselves to those of ordinary skill in the art.

The process of the invention is particularly usefully employed to generate a controlled polarization direction in a ferroelectric material thin film which is deposited on a substrate at elevated temperatures.

As a specific example of the instant method for controlling the polarization direction of a ferroelectric film, a ferroelectric film high dielectric constant material, such as $SrBi_2Ta_2O_9$ or $Pb(Zr,Ti)O_3$ may be used (in the formation of $SrBi_2Ta_2O_9$ tension may advantageously be employed, since the crystalline film contracts in the polarization direction). The film may be deposited on the substrate, following which it is cooled through the Curie temperature with the film in biaxial tension, which leaves most crystalline domains of the film with polarization in the plane of the film (in most cases where the Curie transition leaves the crystal expanded in the polarization). A constraint may be added by either bending the substrate or by putting a film on the back of the substrate having a different differential CTE than the substrate, to exert tensional force on the top surface of the substrate during deposition. This constraint would then be removed before final cooling through the Curie transition.

In general, a post-processing constraint should have an opposite application relative to that of the constraint during growth. For example, to put a ferroelectric film in compression and "push" the polarization direction so that it is perpendicular to the film surface, the substrate should be bent concave upwardly either using a mandrel or by using a backside coating that is in compression at the Curie temperature. For applications where a compressive backside film is needed during post-processing, the CTE of the backside coating should be higher than that of the substrate material, e.g., Si. Additionally, a ferroelectric film which increases in volume via a chemical process such as oxidation during heating will experience further compression as a result of such volumetric change.

For the specific case of processing an oxide ferroelectric through the Curie transition, a sputtered metal film would be oxidized and "pushed" further into compression at the Curie temperature. Metals such as: Ti, Cr, Y, Zr, Nb, Mo, the Lanthanide series, Hf, Ta, W would all work well as backside films for such application. Lower melting point metals such as Al, Sn, Bi, or Pb would tend to deform plastically rather than bending the wafer.

For both ferroelectric random access memory (FeRAM) and pyroelectric sensing films, it is desirable that the polarization direction be normal to the plane of the film. For tetragonal PZT (Zr/Ti <52/48) and using Miller indices of vector representations, the polarization direction is along the c-axis, and c-axis (001) oriented films are therefore highly desirable in parallel plate capacitor geometries. Tensile stress, however, predominates for perovskite films deposited on Si, primarily because the film's CTE is much larger than the substrate's CTE. There may also be a smaller component of tensile or compressive stress that originates with the deposition process and film microstructure, but the contribution of CTE mismatch will normally be dominant. Because the film is formed at temperatures exceeding the Curie point of the PZT, tensile stress present during cooling (from the processing temperature) typically results in a-axis orientation.

A more detailed picture of this stress phenomenon is based on the nature of the phase transition. The high temperature paraelectric phase has cubic symmetry; the low temperature ferroelectric phase can have tetragonal or rhombohedral symmetry depending upon the composition and temperature of the material. Applying Miller indices of symbolic vector representations, the transition occurs in a diffusionless manner by a stretching of the cubic lattice along the polarization direction, a <100>direction (a cube axis) of the parent phase for the tetragonal ferroelectric or a <111>direction of the parent phase for the rhombohedral ferroelectric. Cooling through the transformation, the low temperature phase can choose any of three equivalent <100>directions or any of four equivalent <111>directions (tetragonal or rhombohedral phases respectively) of the parent material to be the polarization direction. Because the polarization direction is stretched during the transformation, a biaxial stress which is tensile will encourage the polarization direction to be in the plane of the film and one which is compressive will encourage the polarization direction to be out of the plane of the film.

Figure 1B:
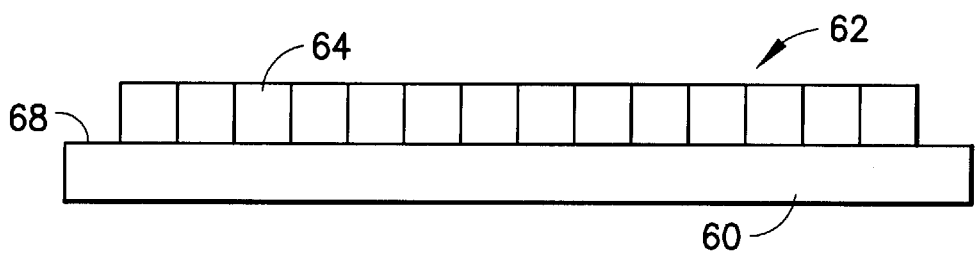
FIG. 1b is a schematic representation of the deposition of a PZT (lead-zirconium-titanate) 40/60 film at 600 degrees Celsius on the substrate.
Figure 1C:
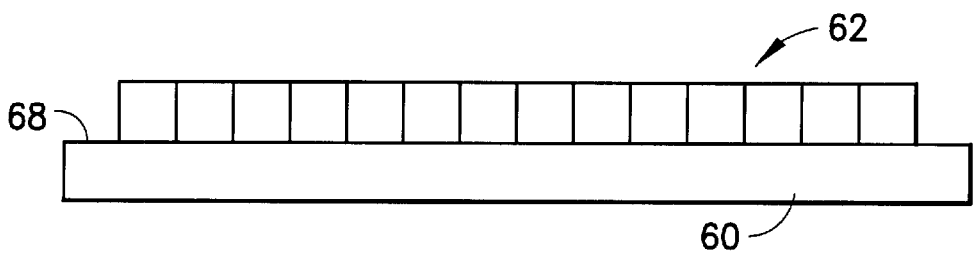
FIG. 1c is a schematic representation of the PZT 40/60 film after cooling down to 410° C. just above the Curie transition temperature.
Figure 1D:
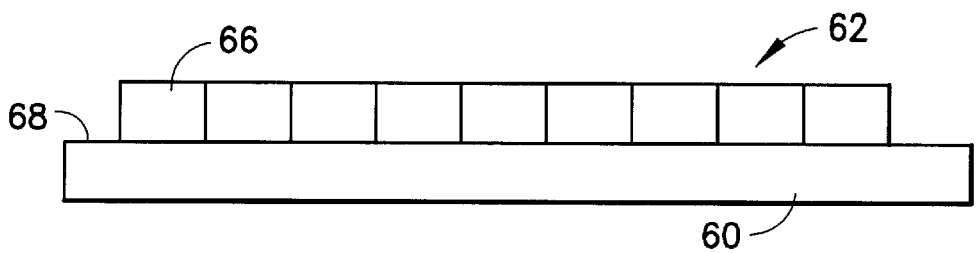
FIG. 1d is a schematic representation of the PZT 40/60 film after cooling down to 390° C. just below the Curie transition temperature.
Figure 1E:
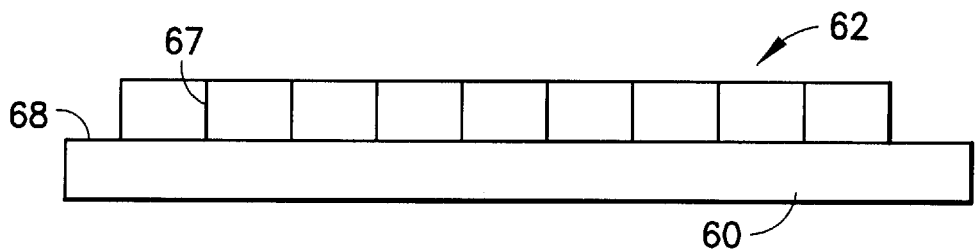
FIG. 1e is a schematic representation of the PZT 40/60 film after cooling to ambient temperature.

Referring now to the drawings, FIGS. 1a–1e are schematic representations of an example of the evolution of stress and orientation for a PZTF 40/60 film deposition on a Si substrate. Cooling the PZT film through the Curie temperature results in a-axis orientation perpendicular to the substrate due to tensile stress in the PZT film. FIG. 1a depicts an uncoated Si substrate 60 prior to the film deposition process on surface 68. Referring now to FIG. 1b, the deposition of the PZT film 62 occurs on the substrate surface 68 at 600° C. At this temperature the PZT film 62 exhibits a perovskite phase cubic structure. The wafer is then subjected to cooling to about 410° C. as depicted in FIG. 1c. At a temperature of approximately 410° C., the PZT film is in tension due to the larger CTE exhibited by PZT film relative to the CTE of the substrate. Further cooling of the wafer to 390° C. as depicted in FIG. 1d causes the PZT film 62 to undergo a phase transition to tetragonal crystal structure 66 and assume an a-axis orientation in order to reduce the tension stress. Referring to FIG. 1e, the wafer is cooled to ambient temperature wherein PZT film 62 maintains its a-axis orientation 67 as the tensile stress continues to increase with cooling.

One approach to making perovskite films with the correct highly preferred (i.e. c-axis) orientation employs the CTE mismatch effect by using MgO substrates which have a higher CTE than the ferroelectric material over the temperature range of interest, i.e., between the growth temperature and the ferroelectric Curie point. A discussion of this phenomenon is treated in "Preparation of c-axis Oriented PLT Thin Films by the Metalorganic Chemical Deposition Method", Tominaga, K. et al., Jap. J. of Appl. Phys. 29(10) L1874-6 (1990). Such an approach has been demonstrated for manufacturing hybrid pyroelectric IR detector arrays, as described in "Preparation and Properties of Lanthanum Modified PbTiO$_3$ Thin Films by rf-Magnetron Sputtering", K. Iijima et al., Proceedings of the Ninth IEEE International Symposium on Applications of Ferroelectrics, R. K. Pandey, Michael Lieu and Ahmad Safari, Eds., p. 53 (1994). Nonetheless, such approach is not suitable for monolithic integration on Si, where the CTE mismatch is unavoidable.

Another approach for controlling perovskite film orientation is to use PbTiO$_3$ and (Pb, La)TiO$_3$ seed layers, but, in general, that approach may require more complex processing and increased costs for the manufacturing equipment. There is therefore a substantial need for an economical method to control orientation of perovskite films, and control of film stress in accordance with the method of the present invention is an attractive technique for such purpose.

Besides controlling crystal orientation in perovskite thin films, the method for stress control that is described herein has general utility in controlling film stress for many other types of films and substrates, and is valuable for applications where film stress determines technologically important properties.

Stress in a thin film can be controlled by mechanically constraining (i.e. deforming) the substrate so that the growth surface is under tension or compression during film growth. If this mechanical restraint is removed following deposition, the final stress state in the film is modified. If the initial growth surface is under tension prior to growth which is released after growth, the film will have reduced tensile stress or increased compressive stress, depending on the magnitude and type of the initial stress state of the film.

FIGS. 2a–2e and 3a–3f demonstrate two methods of bending a wafer to put the wafer top surface in tension during film deposition.

Figure 2A:
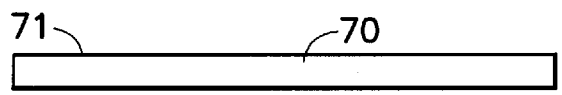
FIG. 2a is a schematic representation of an uncoated substrate.
Figure 2B:
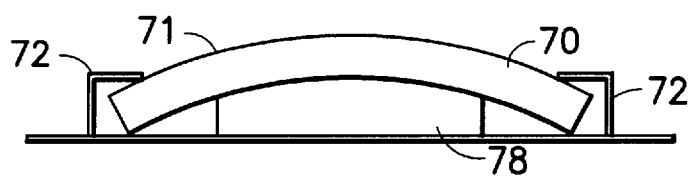
FIG. 2b is a schematic representation of the substrate of FIG. 2a clamped on a curved mandrel in a PZT deposition system.
Figure 2C:
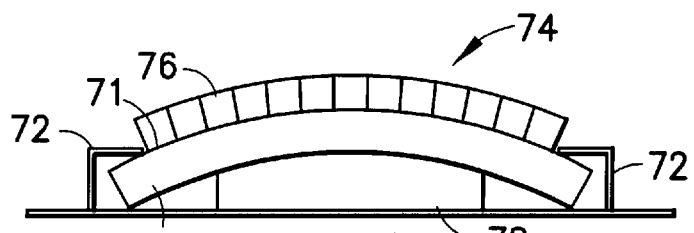
FIG. 2c is a schematic representation of the deposition of a PZT 40/60 film at 600° C. onto the substrate.

Referring to FIGS. 2a–2e, clamps 72 are used to clamp substrate 70 to mandrel 78 having a constant curvature. FIG. 2a shows the uncoated substrate 70 prior to film deposition. Substrate 70 is then clamped over curved mandrel 78 as shown in FIG. 2b using clamps 72. FIG. 2c shows the PZT 40/60 film deposition on substrate surface 71 at a temperature of 600° C. inducing cubic structure 76 during the perovskite crystal phase at that temperature.

Figure 2D:
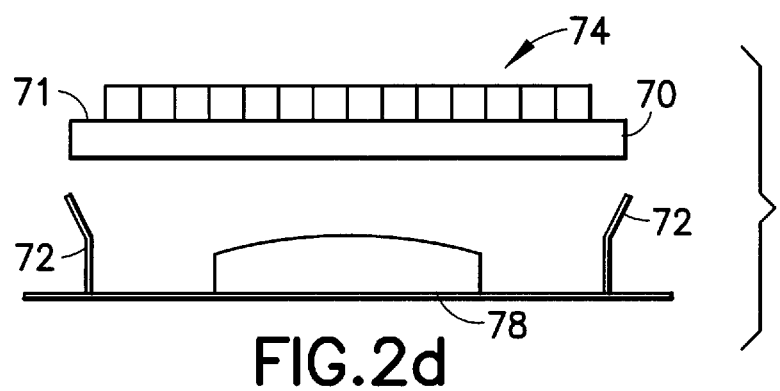
FIG. 2d is a schematic representation of PZT film and substrate being released from the curved mandrel following deposition, at the deposition temperature.
Figure 2E:
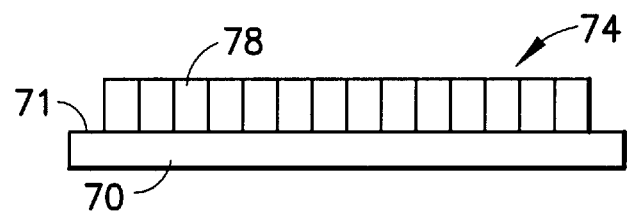
FIG. 2e is a schematic representation of the PZT film and substrate cooled through the phase transition near 400° C.

Referring to FIG. 2d, substrate 70 with PZT film coating 74 is released from curved mandrel 78 by releasing clamps 72 after the deposition phase is complete. The deposition temperature is maintained during the release phase and PZT film 74 attains compressive strength. FIG. 2e depicts the effect of cooling on the crystal structure of PZT film 74 as the wafer is cooled through the phase transition near 400° C. PZT film 74 compressive stress results in c-axis orientation 78.

Figure 3A:
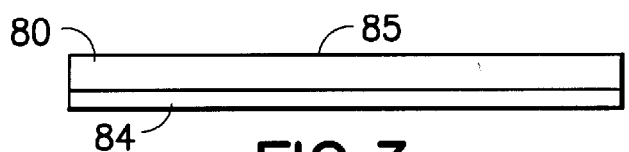
FIG. 3a is a schematic representation of an uncoated substrate at ambient temperature with a "backside coating" on the back surface.

Now referring to FIGS. 3a–3f, a similar stress effect is achieved by a different technique. FIG. 3a shows the wafer material or substrate 80 coated on one side with a backside coating 84. Backside coating 84 comprises a material that is in tension with respect to substrate 80 at the temperature where the ferroelectric object film will be deposited. The tension in backside coating 84 is due to the CTE mismatch coupled with its deposition temperature or due to stress resulting from its deposition conditions and the resulting microstructure.

Figure 3B:
FIG. 3b is a schematic representation of the FIG. 3a uncoated substrate and backside coating, at an elevated temperature, resulting in curvature of the wafer.
Figure 3C:
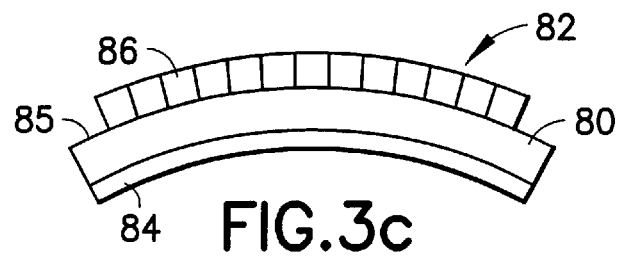
FIG. 3c is a schematic representation of the FIG. 3b substrate with deposition of a PZT 40/60 film at 600° C.
Figure 3D:
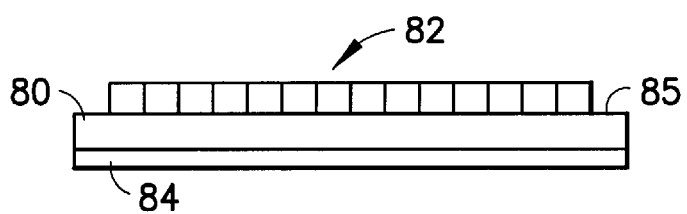
FIG. 3d is a schematic representation of cooling the wafer and PZT film cooled from the deposition temperature.
Figure 3E:
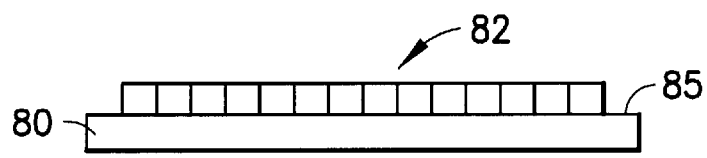
FIG. 3e is a schematic representation of the substrate and PZT film removed from the backside coating by dry etch, wet etch or mechanical means.
Figure 3F:
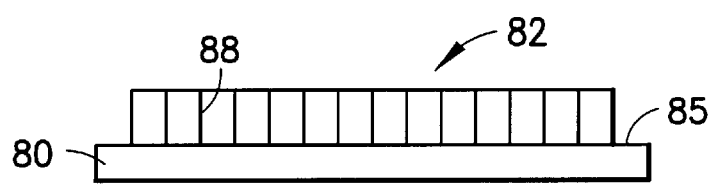
FIG. 3f is a schematic representation of the subsequent annealing of the sample with compressive stress to a temperature above the phase transition temperature.

Referring to FIG. 3b, substrate 80 and backside coating 84 are exposed to elevated temperatures in preparation for film deposition on substrate surface 85. The CTE mismatch between substrate 80 and backside coating 84 and other factors discussed above cause substrate surface 85 to be in tension. FIG. 3c depicts deposition of PZT 40/60 film 82 on surface 85 of substrate 80 at a deposition temperature of approximately 600° C. At this temperature the film exhibits a cubic perovskite crystal phase form 86. Following the film deposition process, the wafer is then cooled causing PZT film 82 to attain tensile stress, as depicted in FIG. 3d. FIG. 3e shows the backside coating 84 depicted in FIGS. 3a–3d, removed from substrate 80 by dry etch, wet etch or a mechanical means. This causes PZT film 82 to go from a tensile stress state to a compressive stress state. Finally, FIG. 3f depicts PZT film 82 subsequent to an annealing processes. The phase transition temperature results in c-axis crystal orientation 88. The removal of the backside film combined with the temperature cooling through the Curie transition and/or annealing process causes the polarization direction of the film to be perpendicular to the wafer surface.

Figure 4:
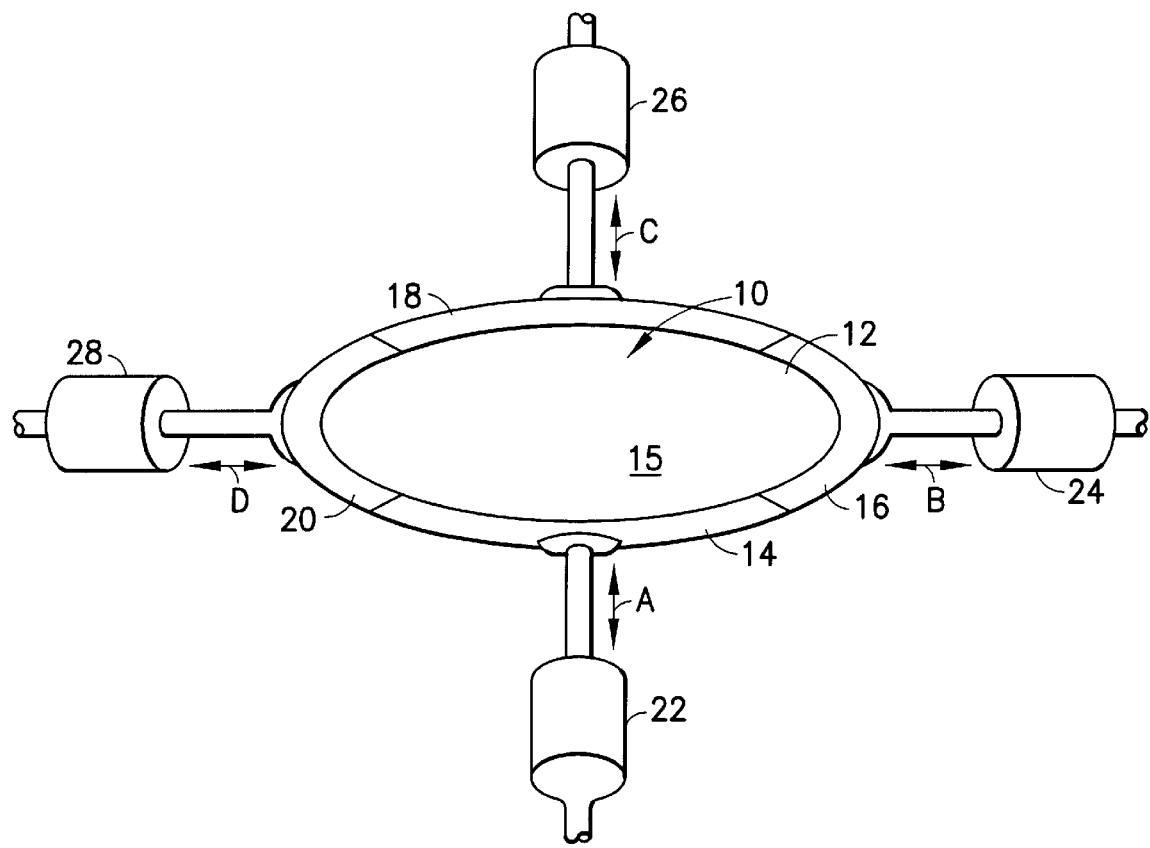
FIG. 4 is a schematic representation of a wafer on which a product film is being grown, and which is being subjected to force to cause the film to be put in compression or alternatively in tension during its formation.

Referring now to FIG. 4, a schematic perspective representation is provided of a wafer 10 on the top surface 12 of which a product film 15 is being grown, and which is being subjected to force to cause the film to be put in compression or alternatively in tension during its formation.

As illustrated, the wafer 10 is gripped at its peripheral edge by the sectorial engagement members 14, 16, 18 and 20 which are respectively joined-in turn to the reciprocating drive units 22, 24, 26 and 28 arranged to advance or retract the sectorial engagement members in the respective directions indicated by bidirectional arrows A, B, C and D.

Each of the sectorial engagement members may suitably have a groove on its inner peripheral surface which engagingly mates with and grips the corresponding sector of the wafer. The sectional engagement members may in this respect be fabricated with a jaw or ratchet structure which in retraction (radially outward movement of the sectional engagement members) acts to firmly grip the wafer edge to better exert retractive tensional force on the wafer. Alternatively, the sectional engagement members may be advanced (radially inward movement of the sectional engagement members) to impart a compressive force on the edge surface which is translated through the body of the wafer to exert compressive force thereon.

Thus, in the operation of the FIG. 4 force exertion assembly, the force (compressive or tensional) which is exerted on the wafer is transmitted by the wafer to the thin film being formed on the face of the wafer.

Figure 5:
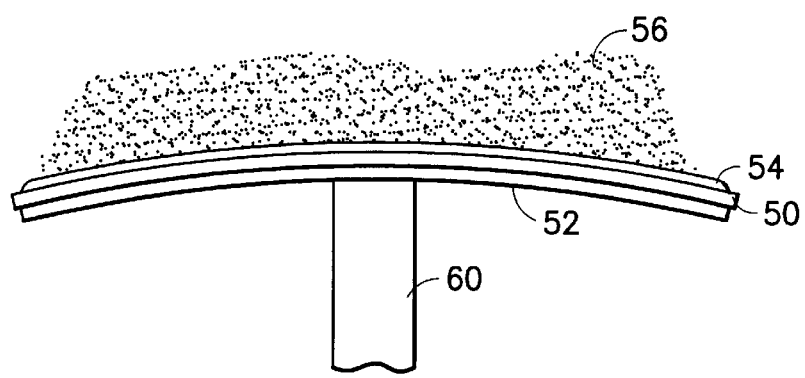
FIG. 5 is a schematic representation of a wafer to the back of which is joined a backside film element, causing the product film to be placed in tension.

FIG. 5 is a schematic representation of a wafer 50 to the back of which is joined a backside film element 52, causing the product film 54 to be placed in tension. The product film 54 is shown as being formed by vapor phase deposition from vapor 56. The backside film element 52 is mounted on a pedestal 60, allowing free flexure of the backside film element as a result of the difference in CTE between the backside film element and the wafer at the elevated temperature conditions at which the deposition of the product film takes place.

As a result of the CTE difference between the wafer and the backside film element, the wafer is placed in tension as the wafer deforms to accommodate the lower CTE of the backside film element, presenting a convex wafer surface to the vapor, and placing the substrate front side in tension, thereby placing the film in compression when the constraint is released.

The advantage of using the method of constraining the substrate over a curved mandrel as depicted in FIGS. 2a–2e, is that it can be done quickly and easily in a growth (film deposition) reactor and then released before the initial cooling from the deposition temperature. A wafer holder in the shape of a curved mandrel with clamps makes handling of the stressed film easier. Additional heating through or near the Curie temperature is necessary to pole the ferroelectric perpendicular to the wafer after the ferroelectric has been released from the holder. In the case that mechanical clamping of the wafer over the curved mandrel induces the formation of undesirable particles, the wafer can be clamped at the edges with a pressure differential across it. This approach is similar to the approach used as a temperature control technique in some deposition equipment systems and is useful for generating a small well-controlled curvature.

The stress forming technique depicted in FIGS. 3a–3f and FIG. 5, i.e., coating the backside of the wafer with a film in tension at the phase transition temperature, is well-suited to standard wafer processing as currently practiced by the semiconductor industry. The backside coating is applied before the ferroelectric coating. The wafer is heated and the ferroelectric coating deposited. The wafer is then cooled, the backside coating etched or polished away, and then the wafer with ferroelectric coating is reheated through or near the Curie transition. An anneal of this sort is appropriate after deposition of a top electrode on the ferroelectric, and so this approach involves no additional processing steps besides deposition and removal of the backside coating.

In evaluating appropriate backside coatings, consideration is given to the total stress at a given temperature, which is the sum of the intrinsic (microstructure) and extrinsic (CTE mismatch) contributions. Each of these factors may be manipulated as needed to achieve some amount of tensile stress in the backside coating when the wafer is near the phase transition temperature (400° C.).

Relevant factors to consider when selecting an appropriate substrate and associated backside coating include the following: (1) The backside coating should having a low CTE material (preferably less than the substrate material, e.g. Si), so that the growth surface goes further into tension as the wafer temperature is increased from ambient to the ferroelectric deposition temperature; (2) The backside coating should have a high stiffness and be thicker than the object film (ferroelectric film) in order increase the amount of strain on the topside of the wafer; (3) The backside coating should be less than fully dense at its deposition, and be densifying as it is heated to the ferroelectric deposition temperature, which would result in additional tension on the front side of the wafer; (4) The backside coating should have mechanical integrity so that it can bend the substrate sufficiently; and (5) With regard to the wafer, a thinner wafer allows more bending strain at the topside of the wafer with the same stress and thickness of the backside film.

When preparing the substrate with the appropriate backside coating, the coating should be deposited at temperatures below the ferroelectric phase transition temperature. Since extrinsic stress in the backside coating is near zero at that temperature, its stress will be tensile at higher temperatures if the backside coating has a high stiffness and is applied at a greater thickness than the object film. Since backside coatings with reasonable integrity often have intrinsic compressive stress, the absolute value of the extrinsic stress implemented should exceed the compressive intrinsic stress. Both $SiO_2$ and $Si_3N_4$ are prime candidate materials for the backside coating as they have low CTEs, and processes to produce them with a variety of stresses and densities are in current practice. The etching and polishing behavior of these two compounds is also well understood.

The amount of bending which can be applied to the wafer at the film deposition temperature can be estimated. The ferroelectric film should have no stress or be in biaxial compression if it has all of its c-axis perpendicular to the wafer just below the Curie temperature. The final desired state [no stress and (001) domains] should be compared to the state at the Curie temperature when the wafer is not constrained at the deposition temperature.

The effectiveness of wafer bending on thin films (e.g., of PZT, by way of illustration) can be analyzed by the following two steps: (1) Determining the strain at the Curie temperature in the PZT film when it is coated on an unconstrained wafer, and (2) Determining the amount of additional tensile strain that would be required to be applied to the film if all of the domains that are in the (100) orientation, when the wafer is coated in the unconstrained state, are converted to (001) domains. If the wafer is then constrained during coating such that its top surface has the sum of these two components, then the PZT film should have no stress just below the Curie temperature when all domains are switched to be perpendicular to the wafer surface.

Strain at the Curie temperature when the wafer is not constrained at the deposition temperature is determined by measuring the stress in the film at room temperature when the film was deposited with no wafer constraint, and then calculating the strain at the Curie temperature using the coefficients of thermal expansion and the elastic modulae of the film and substrate. Strain resulting from conversion from (100) orientation to (001) orientation is determined from the relative intensities and peak positions of X-ray diffraction of the (100) and (001) reflections at room temperature. The relative intensities indicate the amount of (100) orientation that must be converted to (001) orientation and the relative peak positions indicate the amount of strain in each volume that is converted. The foregoing assumes that the coefficient of thermal-expansion is the same in the [100] and [001] directions.

It will be recognized that the techniques of the present invention are usefully employed with substrates having CTE values that are larger than that of the ferroelectric film to be formed thereon, and where it is desired that the polar axis lie in the plane of the film, e.g., for use of interdigitated electrodes on a PZT film deposited on an MgO substrate. In such case, the desired curvature is reversed and the flexure may be imparted in a similar way, e.g., mechanically by use of a mandrel, or by the use of a backside film. For the backside film, the CTE values chosen would be opposite to those discussed hereinabove for Si substrates.

While the invention has been illustratively described herein with reference to various illustrative aspects, features and embodiments, it will be appreciated that the utility of the invention is not thus limited, but that the invention may alternatively be embodied in other variations, modifications and embodiments. The claims following are therefore to be construed to encompass all such variations, modifications and other embodiments within the spirit and scope thereof.

What is claimed is:

1. A method of forming a product ferroelectric film on a substrate having front and back surfaces, comprising the steps of:

coating the substrate on the back surface thereof with a backside coating of a material that is in tension with respect to the substrate at deposition temperature of the ferroelectric film;

depositing the ferroelectric film on the front surface of the substrate at said deposition temperature;

cooling the substrate having the ferroelectric film and backside coating thereon to cause the ferroelectric film to attain tensile stress;

removing the backside coating from the substrate, to cause the ferroelectric film to change from a tensile stress state to a compressive stress state; and thermally processing the substrate having the ferroelectric film thereon, to cause the polarization direction of the ferroelectric film to be perpendicular to the substrate surface, thereby forming the product ferroelectric film.

2. The process of claim 1, wherein the backside coating material comprises $SiO_2$.

3. The process of claim 1, wherein the backside coating material comprises $Si_3N_4$.

4. The process of claim 1, wherein said thermally processing step comprises cooling through the Curie transition and/or annealing the ferroelectric film.

5. The process of claim 1, wherein said thermally processing step comprises reheating the substrate and ferroelectric film through or near the Curie transition.

6. The process of claim 1, wherein said thermally processing step comprises annealing after deposition of an electrode on the ferroelectric film.

7. The process of claim 1, wherein said backside coating is removed from the substrate by etching same away from the substrate.

8. The process of claim 7, wherein said etching comprises dry etching.

9. The process of claim 7, wherein said etching comprises wet etching.

10. The process of claim 7, wherein said backside coating is removed from the substrate by mechanical removal.

11. The process of claim 1, wherein the ferroelectric film comprises PZT.

12. The process of claim 1, wherein the ferroelectric film comprises strontium bismuth tantalate.

13. The method of claim 1, wherein the backside coating has a CTE lower than the substrate material, and has a thickness greater than that of the ferroelectric film.

14. A method of forming a product ferroelectric film on a substrate, comprising deposition of ferroelectric film material on the substrate, and placing the ferroelectric film in compression to yield a polarization direction of the ferroelectric film that is perpendicular to the surface of the ferroelectric film, comprising bending the substrate concave upwardly to exert said compression, before or during said deposition of ferroelectric film material on the substrate.

15. The method of claim 14, wherein the substrate is bent concave upwardly by use of a mandrel.

16. The method of claim 14, wherein the substrate is bent concave upwardly by application to a back side of the substrate a backside coating that is in compression at the Curie temperature of the ferroelectric film.

17. A method of producing a wafer product comprising a wafer with a thin film thereon, wherein the thin film properties are stress dependent said process comprising exerting a radially directed force at a periphery of the wafer, and depositing thin film material on the surface of the wafer during exertion of said radially directed force at the periphery of the wafer.

18. The method of claim 17, wherein said radially directed force is radially outwardly exerted at the periphery of the wafer.

19. A method of producing a wafer product comprising a wafer with a thin film thereon, wherein the thin film properties are stress dependent, said process comprising exerting a radially directed force at a periphery of the wafer, and depositing thin film material on the surface of the wafer during exertion of said radially directed force at the periphery of the wafer, wherein said radially directed force is radially compressively exerted at the periphery of the wafer.

20. A method of forming a film on a substrate, wherein the thin film comprises a material selected from the group consisting of steel, memory alloys, dielectric materials, polymeric materials, and piezoelectric materials, said method comprising depositing said material on the substrate without imposing force on the substrate to induce stress in the thin film, and processing the thin film after its deposition on the substrate, said processing including imposing force on the substrate to modify properties of the thin film or its post-deposition development.

* * * * *

UNITED STATES PATENT AND TRADEMARK OFFICE
CERTIFICATE OF CORRECTION

PATENT NO.        : 6,514,835 B1
APPLICATION NO.   : 09/676283
DATED             : February 4, 2003
INVENTOR(S)       : Bryan C. Hendrix et al.

It is certified that error appears in the above-identified patent and that said Letters Patent is hereby corrected as shown below:

Column 1, line 5: "This is a continuation division of U.S. application Ser." should be -- This is a continuation of U.S. Application Ser. --.

Signed and Sealed this

Thirtieth Day of November, 2010

David J. Kappos
*Director of the United States Patent and Trademark Office*